(12) United States Patent
Purdy et al.

(10) Patent No.: US 7,153,709 B1
(45) Date of Patent: Dec. 26, 2006

(54) METHOD AND APPARATUS FOR CALIBRATING DEGRADABLE COMPONENTS USING PROCESS STATE DATA

(75) Inventors: Matthew A. Purdy, Austin, TX (US); Richard J. Markle, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 248 days.

(21) Appl. No.: 10/930,257

(22) Filed: Aug. 31, 2004

(51) Int. Cl.
*H01L 21/00* (2006.01)
(52) U.S. Cl. .......................................... 438/4; 438/12
(58) Field of Classification Search .................. 438/4, 438/5, 7, 10, 12, 14, 16, 17; 700/121
See application file for complete search history.

(56) References Cited

U.S. PATENT DOCUMENTS

| | | | | |
|---|---|---|---|---|
| 5,808,175 A | * | 9/1998 | Chang | 73/1.58 |
| 2002/0139418 A1 | * | 10/2002 | Tinsley et al. | 137/487.5 |
| 2005/0159911 A1 | * | 7/2005 | Funk et al. | 700/121 |
| 2005/0177269 A1 | * | 8/2005 | Funk | 700/121 |
| 2005/0187649 A1 | * | 8/2005 | Funk et al. | 700/121 |
| 2005/0284570 A1 | * | 12/2005 | Doran et al. | 156/345.24 |

* cited by examiner

*Primary Examiner*—Kevin M. Picardat
(74) *Attorney, Agent, or Firm*—Williams, Morgan & Amerson

(57) ABSTRACT

The present invention is generally directed to various methods and systems for calibrating degradable components using process state data. In one illustrative embodiment, the method includes providing a tool comprised of at least one process chamber, providing at least one process state sensor that is adapted to obtain process state data regarding at least one characteristic of a process environment established in the chamber in performance of a process operation, operatively coupling at least one of a new or repaired degradable component to the tool, and calibrating the new or repaired degradable component based upon the process state data. In further embodiments, the method comprises processing a plurality of additional workpieces in the tool after the new or repaired degradable components have been calibrated using process state data in accordance with one aspect of the present invention.

23 Claims, 3 Drawing Sheets

METHOD AND APPARATUS FOR CALIBRATING DEGRADABLE COMPONENTS USING PROCESS STATE DATA

BACKGROUND OF THE INVENTION

1. Field of the Invention

This invention relates generally to industrial processes, and, more particularly, to a method and apparatus for calibrating degradable components using process state data.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of process tools, including photolithography steppers, etch tools, deposition tools, polishing tools, thermal anneal process tools, implantation tools, etc. The technologies underlying semiconductor process tools have attracted increased attention over the last several years, resulting in substantial refinements. However, despite the advances made in this area, many of the process tools that are currently commercially available suffer certain deficiencies. In particular, some of such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various process tools. The manufacturing tools communicate with a manufacturing framework or a network of processing modules. Each manufacturing tool is generally connected to an equipment interface. The equipment interface is connected to a machine interface that facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process, various events may take place that may affect the performance of the devices being fabricated. That is, variations in the fabrication process steps may result in device performance variations. Factors, such as feature critical dimensions, doping levels, contact resistance, particle contamination, etc., all may potentially affect the end performance of the device. Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Target values for the various processes performed are generally based on design values for the devices being fabricated. For example, a particular process layer may have a target thickness. Operating recipes for deposition tools and/or polishing tools may be automatically controlled to reduce variation about the target thickness. In another example, the critical dimensions of a transistor gate electrode may have an associated target value. The operating recipes of photolithography tools and/or etch tools may be automatically controlled to achieve the target critical dimensions.

Typically, a control model is used to generate control actions for changing the operating recipe settings for a tool being controlled based on feedback or feedforward metrology data collected related to the processing by the tool. To function effectively, a control model must be provided with metrology data in a timely manner and at a quantity sufficient to maintain its ability to predict the future operation of the tool it controls.

Within many manufacturing industries, great effort is made to insure that processing operations are performed accurately such that the resulting device meets target specifications. This is particularly true within the semiconductor manufacturing industry wherein many metrology tools and sensors are used to acquire a vast amount of metrology data to determine the effectiveness and accuracy of the processing operations performed in a tool and/or the compliance of the resulting workpiece with product specifications. Additionally, modern semiconductor manufacturing tools have a number of components or devices that perform various functions in connection with the processing of semiconducting wafers in the manufacturing tool. For example, such components may include one or more mass flow controllers (MFC) that are used to regulate the flow of various process gases used in the tool, or electrical components that enable a plasma to be established within the tool. Another example of such a component is a so-called showerhead that is used in some process tools wherein a plasma is created for various process reasons.

Unfortunately, such sensors and components are degradable in nature, i.e., they wear out over time. As indicated above, manufacturing integrated circuit devices is a very challenging operation. Thus, it is extremely important that if the sensors and components used in a process tool start to degrade, they are repaired or replaced with new components or sensors as soon as possible so that manufacturing activities can continue.

However, the calibration of such new or repaired components and sensors may be less than desirable. That is, such tools or components may not be calibrated at all, e.g., a replacement showerhead, or the accuracy of the original calibration of the component or sensor may be less than desired or may be different from that of the component or sensor that is to be replaced or repaired. Given the sensitivity of many process operations, such calibration errors may introduce unacceptable processing errors and/or create difficulties in controlling the various processing operations with the desired degree of accuracy.

The present invention is directed to overcoming, or at least reducing the effects of, one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to various methods and systems for calibrating degradable components using process state data. In one illustrative embodiment, the method comprises providing a tool comprised of at least one process chamber, providing at least one process state sensor that is adapted to obtain process state data regarding at least one characteristic of a process environment established in the chamber in performance of a process operation, operatively coupling at least one of a new or repaired degradable component to the tool, and calibrating the new or repaired degradable component based upon the process state data. In further embodiments, the method comprises processing a plurality of additional workpieces in the process tool after the new or repaired degradable components have been calibrated using process state data in accordance with one aspect of the present invention.

In another illustrative embodiment, the method comprises providing a tool comprised of at least one process chamber, providing at least one process state sensor that is adapted to obtain process state data regarding at least one characteristic of a process environment established in the chamber in performance of a process operation, providing a controller that is adapted to access the process state data, and operatively coupling at least one of a new or repaired degradable component to the tool, wherein the controller performs the step of calibrating the new or repaired degradable component based upon the process state data.

In yet another illustrative embodiment, the method comprises providing a tool comprised of at least one process chamber, providing at least one process state sensor that is adapted to obtain process state data regarding at least one characteristic of a process environment established in the chamber in performance of a process operation, providing a controller that is adapted to access the process state data, and operatively coupling at least one of a new or repaired degradable component to the tool, the new or repaired degradable component having an initial calibration, wherein the controller performs the step of confirming that the initial calibration of the new or repaired degradable component is correct based upon the process state data.

BRIEF DESCRIPTION OF THE DRAWINGS

The invention may be understood by reference to the following description taken in conjunction with the accompanying drawings, in which like reference numerals identify like elements, and in which.

Figure 1:
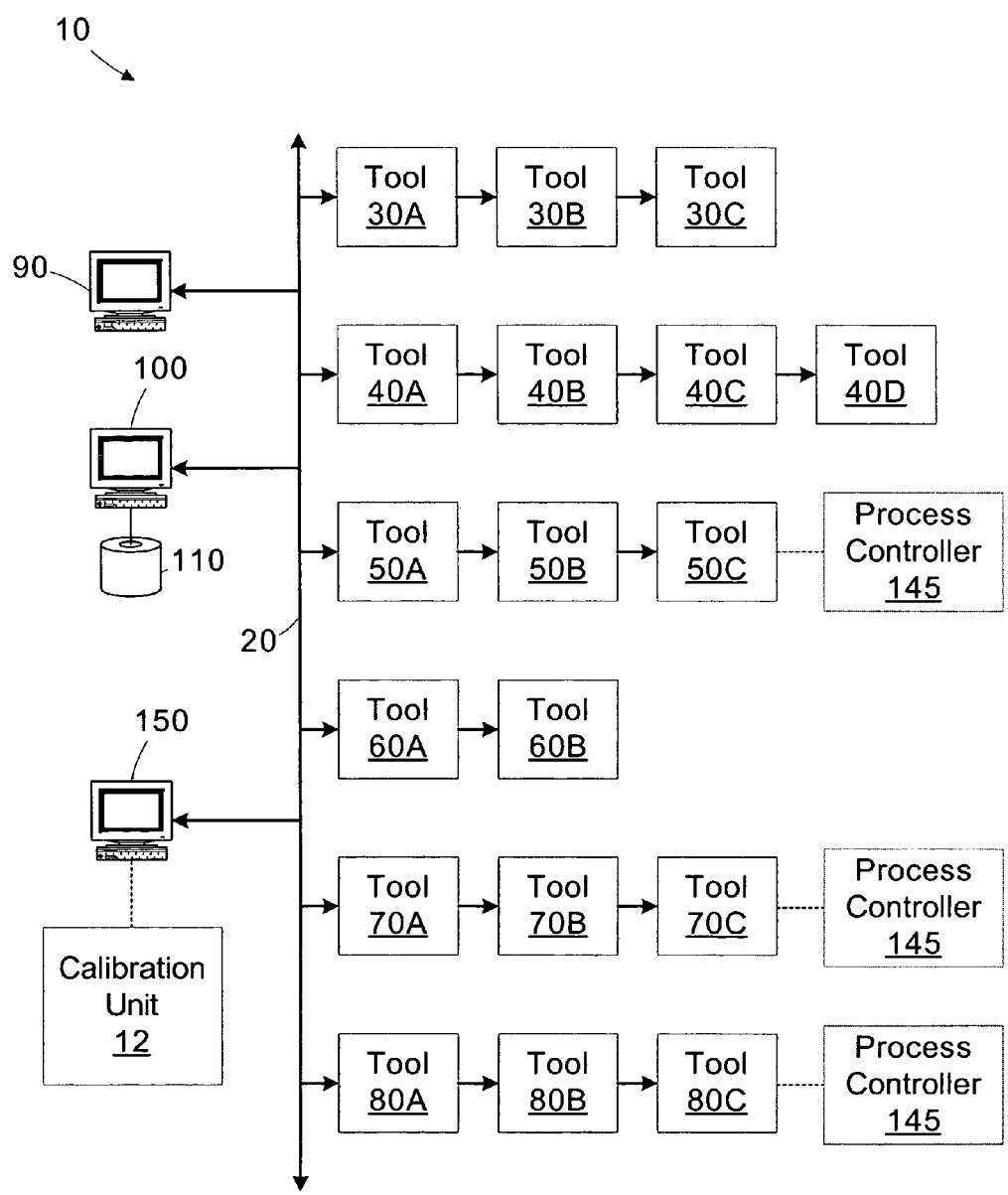
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment include photolithography steppers, etch tools, deposition tools, polishing tools, rapid thermal anneal tools, implantation tools, etc. The tools 30–80 are illustrated in a rank and file grouping for illustrative purposes only. In an actual implementation, the tools 30–80 may be arranged in any physical order or grouping. Additionally, the connections between the tools in a particular grouping are meant to represent connections to the network 20, rather than interconnections between the tools 30–80.

A manufacturing execution system (MES) server or controller 90 directs high level operation of the manufacturing system 10. The MES server 90 may monitor the status of the various entities in the manufacturing system 10 (i.e., lots, tools 30–80) and control the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, operating recipes, etc. The controller 90 may also provide operating recipes to one or more of the tools depicted in FIG. 1. Of course, the controller 90 need not perform all of these functions. Moreover, the functions described for the controller 90 may be performed by one or more computers spread throughout the system 10.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The manufacturing system 10 also includes a calibration unit 12 executing on an illustrative workstation 150. As described more fully below, the calibration unit 12 may use process data to calibrate new or repaired degradable components (sensors or devices) that are operatively coupled to a manufacturing tool. As used herein, the term "calibrate" or "calibrating" shall be understood to include calibrating a component relative to a known standard and/or calibrating a component relative to a reference that is not a known standard, e.g., in intermediate reference. "Calibrating" shall also be understood to include matching a component to an arbitrary reference value. The calibration unit 12 described herein may be used as described herein with any type of tool that is used to perform any type of operation, e.g., etch tools, deposition tools, ion implant tools, CMP tools, etc. Thus, the present invention should not be considered as limited in use to any particular type of tool.

The calibration unit 12 may communicate with the controller 90 and/or with one or more process controllers 145 associated with the individual tools 30–80 for purposes to be described later herein. The particular control models used by the process controllers 145 depend on the type of tool 30–80 being controlled. The control models may be developed empirically using commonly known linear or non-linear techniques. The control models may be relatively simple equation-based models (e.g., linear, exponential, weighted average, etc.) or a more complex model, such as a neural network model, principal component analysis (PCA) model, partial least squares projection to latent structures (PLS) model. The specific implementation of the control models may vary depending on the modeling techniques selected and the process being controlled. The selection and development of the particular control models would be within the ability of one of ordinary skill in the art, and accordingly, the control models are not described in greater detail herein for clarity and to avoid obscuring the instant invention.

An exemplary information exchange and process control framework suitable for use in the manufacturing system 10 is an Advanced Process Control (APC) framework, such as may be implemented using the Catalyst system formerly offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The processing and data storage functions are distributed amongst the different computers or workstations in FIG. 1 to provide general independence and central information storage. Of course, different numbers of computers and different arrangements may be used without departing from the spirit and scope of the instant invention.

Figure 2A:
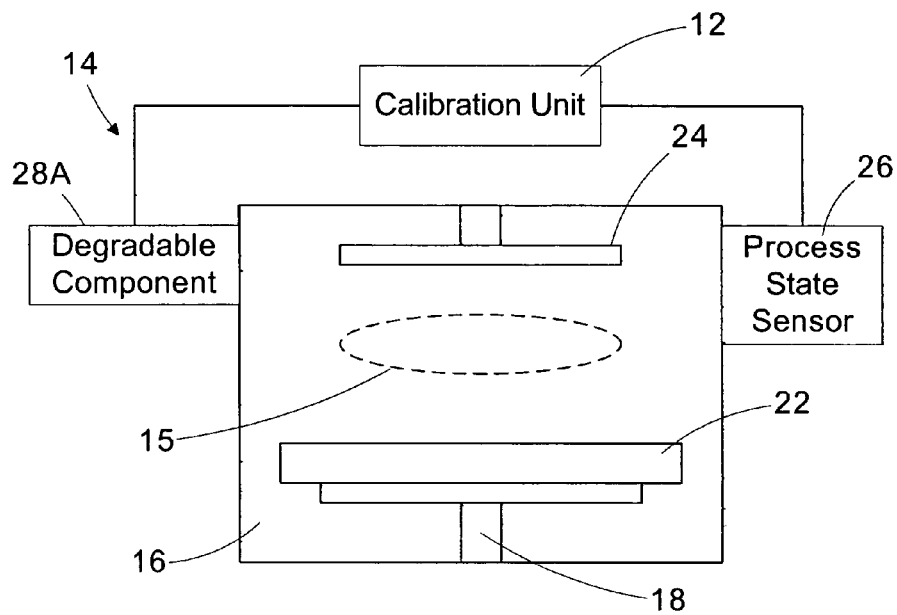
FIGS. 2A–2B are schematic depictions of an illustrative tool employing an illustrative calibration unit in accordance with one illustrative embodiment of the present invention.

Illustrative aspects of the present invention will now be described with reference to FIGS. 2A–2B. As depicted in FIG. 2A, an illustrative process tool 14 is comprised of a process chamber 16, a wafer stage 18, having an illustrative semiconducting wafer 22 positioned thereon, and a showerhead 24. In this illustrative embodiment, the process tool 14 is configured such that a plasma 15 may be generated within the chamber 16 during the performance of a process operation on the wafer 22. Also depicted in FIG. 2A is a process state sensor 26 and a degradable component 28A, both of which are operatively coupled to the tool 14 and/or chamber 16. The calibration unit 12 is operatively coupled to both the process state sensor 26 and the degradable component 28A in the sense that it is adapted to receive or access data acquired by the process state sensor 26 and, if the degradable component 28A is a sensor, data obtained by that sensor. The calibration unit 12 may also be able to control operational characteristics of the degradable component 28A.

As will be recognized by those skilled in the art after a complete reading of the present application, the tool 14 depicted in FIG. 2A is schematically depicted. Various operational aspects and equipment associated with such a tool are not provided so as not to obscure the present invention. Moreover, although a single process state sensor 26 and degradable component 28A are depicted in FIG. 2A, in reality, there may be many process state sensors and many degradable components operatively coupled to the tool 14. It should also be understood from the previous introduction that the illustrative tool 14 depicted in FIG. 2A is provided by way of example only as the present invention may be employed with a variety of different process tools capable of performing a variety of different process operations, e.g., an etch tool, a lithography track, an exposure tool (scanner or stepper), a deposition tool, a wet chemical bath tool, an ion implant tool, a CMP tool, a copper plating tool, etc. Moreover, the tool 14 may have more than one process chamber 16. Thus, the particular configuration of the tool and the process operation it performs should not be considered a limitation of the present invention.

In general, the process state sensor 26 is any sensor that is adapted to measure at least one parameter or characteristic of the atmosphere or environment within the process chamber 16 as processing operations are performed on wafers positioned therein. For example, the process state sensor 26 may be adapted to measure a chemical species in the process environment, the moisture within the process chamber 16, the individual gas species present within the processing environment and their respective partial pressures, the temperature within the process chamber 16 and/or one or more characteristics or parameters of the illustrative plasma 15 depicted therein, if the process operation calls for such a plasma. By way of example only, the process state sensor 26 may be a temperature sensor, a pressure sensor, an optical emission spectroscopy (OES) sensor, a residual gas analyzer (RGA) that is adapted to perform mass spectrometry, a Fourier transform infra red sensor (FTIR) that is adapted to determine the concentration of various species of gases within the chamber 16. The process sensor 26 may also be an RF voltage sensor of an RF current sensor useful in determining various characteristics of a plasma. The process sensor 26 may also be a sensor adapted to sense particle levels in a gas or a liquid using, for example, scattered light. Thus, the particular type of process state sensor 26 employed in connection with the present invention may vary depending upon the application and it should not be considered a limitation of the present invention.

As indicated above, the process state sensor 26 is adapted to obtain process state data regarding the processing environment within the chamber 16 as processing operations are performed on various wafers processed in the tool 14. The type and quantity of data collected by the process state sensor 26 may vary depending upon the application. Moreover, such data may be in any form and it may be stored at various locations throughout the manufacturing system 10. The process state data may be averaged or otherwise statistically manipulated. The process state data obtained by the process state sensor 26 may be accessed by or provided to the calibration unit 12 for purposes to be described more fully below.

As indicated in FIG. 2A, one or more degradable components 28A may be operatively coupled to the tool 14 and/or chamber 16. The degradable component 28A depicted in FIG. 2A is intended to be representative in nature in that it is representative of any component, i.e., device or sensor, whose performance capability may degrade due to a variety of reasons, e.g., excessive use over an extended period of time, internal malfunctions within the device or sensor, etc. There may be many such degradable components 28A operatively coupled to the tool 14. By way of example only, the degradable components 28A may be a temperature sensor, a pressure sensor, a mass flow controller (MFC), a showerhead, various electrical components used to generate the plasma 15 within the chamber 16, gas or liquid flow control devices, gas or liquid filters, etc.

Figure 2B:
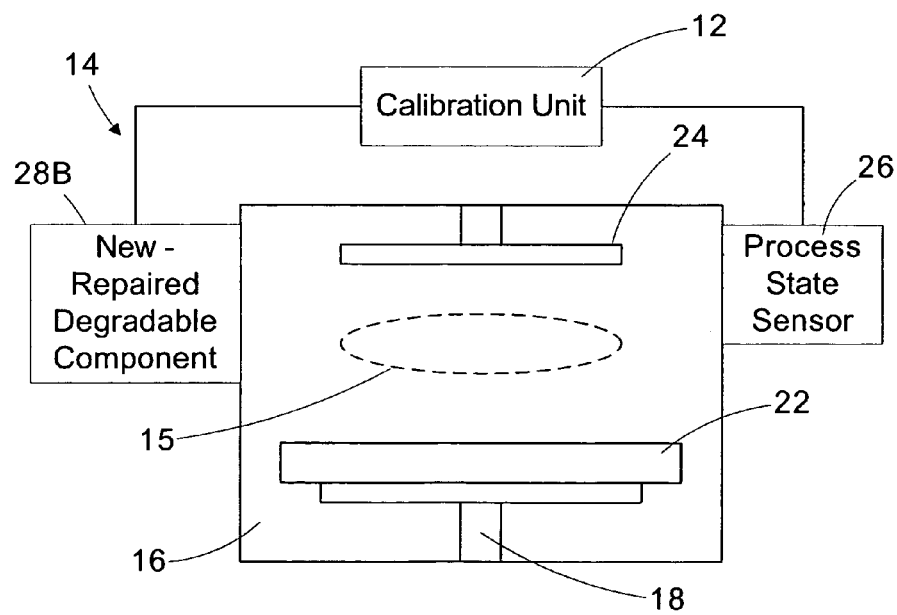

FIG. 2B depicts the process tool 14 wherein a new or repaired degradable component 28B has been operatively coupled to the process tool 14. That is, once the performance capability of the degradable component 28A (FIG. 2A) has reached a certain level, it must be repaired or replaced with a component that performs substantially the same functions. The component 28B may be a brand new component, it may be a previously repaired component, or it may be the component 28A actually removed from the process tool 14 and repaired and replaced on the process tool 14.

In accordance with one aspect of the present invention, the calibration unit 12 may use process state data obtained by the process state sensor 26 to calibrate the new or repaired degradable component 28B once it is operatively coupled to the tool 14. As indicated previously, the calibration, or matching, may be relative to a known standard and/or relative to an arbitrary intermediate reference. One illustrative example of an intermediate reference would be to calibrate, or match, a new or repaired degradable component 28B based upon the data obtained by a previous component that is being replaced or repaired.

In manufacturing integrated circuit devices, one important condition for success of processing operations is to insure that the processing environment within the chamber 16 is maintained with certain desired characteristics as hundreds of wafers are processed through the process tool 14. To that end, the calibration unit 12 of the present invention employs process state data regarding the processing environment within the chamber 16 to calibrate the new or repaired degradable component 28B. For example, using the tool configuration depicted in FIG. 2A, a process state sensor, e.g., a residual gas analyzer, may measure the process environment within the chamber 16 over a period of time as wafers are processed therethrough and determine that the partial pressure of hydrogen ($H_2$) in the chamber 16 during processing operations was approximately 100 mTorr. However, after a new or repaired mass flow controller 28B is operatively coupled to the tool 14, measurements obtained using the residual gas analyzer 26 indicate that the partial pressure of hydrogen is approximately 150 mTorr.

Accordingly, based upon this data, the calibration unit 12 may adjust the calibration of the new mass flow controller 28B downward by a factor of 33% such that the flow rate of process gas through the new mass flow controller 28B is adjusted so that the partial pressure of hydrogen within the chamber 16 is again approximately 100 mTorr. In a particular example, this may involve applying a correction factor to a signal from the new mass flow controller 28B as to its operational state, e.g., the quantity of gas flowing through the new or repaired mass flow controller 28B. For example, if the new or repaired mass flow controller 28B indicates that it is flowing 60 sccm of hydrogen, the calibration unit 12 may apply a correction factor to the reading from the new mass flow controller unit such that it adjusts its indicated flow rate upward by 66%, thereby reestablishing a flow rate of approximately 100 sccm of hydrogen.

As will be recognized by those skilled in the art after a complete reading of the present application, the methods described herein may be employed with degradable components that are initially uncalibrated or it may be employed in confirming or correcting degradable components that are initially calibrated prior to being operatively coupled to the tool 14. For example, with respect to a non-calibrated device, e.g., a showerhead (or filter), the process state data obtained by the process state sensor 26 may be employed to regulate the flow of various process gases through the showerhead such that one or more characteristics of the processing environment within the process chamber 16 may be retained at a desired level. With respect to degradable components that are calibrated prior to being operatively coupled to the process tool 14, the methodologies disclosed herein may be used to confirm the correctness of the initial calibration of the new or repaired degradable component 28B, or to correct or adjust the calibration of the new or repaired degradable component 28B.

In further embodiments, various limits or constraints may be imposed on the calibration of the new or repaired degraded component 28B. For example, if the methodologies described herein result in the calibration unit 12 indicating that adjustments to the new or repaired degradable component 28B exceed a preselected limit or allowable range, a fault may be declared. The preselected limit or allowable range may be based upon absolute values or relative values. In that case, the process tool 14 may be shut down and maintenance personnel may be notified regarding the declaration of a fault condition. Appropriate corrective actions may be taken, e.g., a different new or repaired component 28B may be operatively coupled to the tool 14. As a specific example, if the calibration unit 12 determines that a correction factor in excess of 50% (a relative value) or in excess of 50 mTorr (an absolute value) needs to be provided by the new or repaired degradable component 28B, then a fault may be declared.

Figure 3:
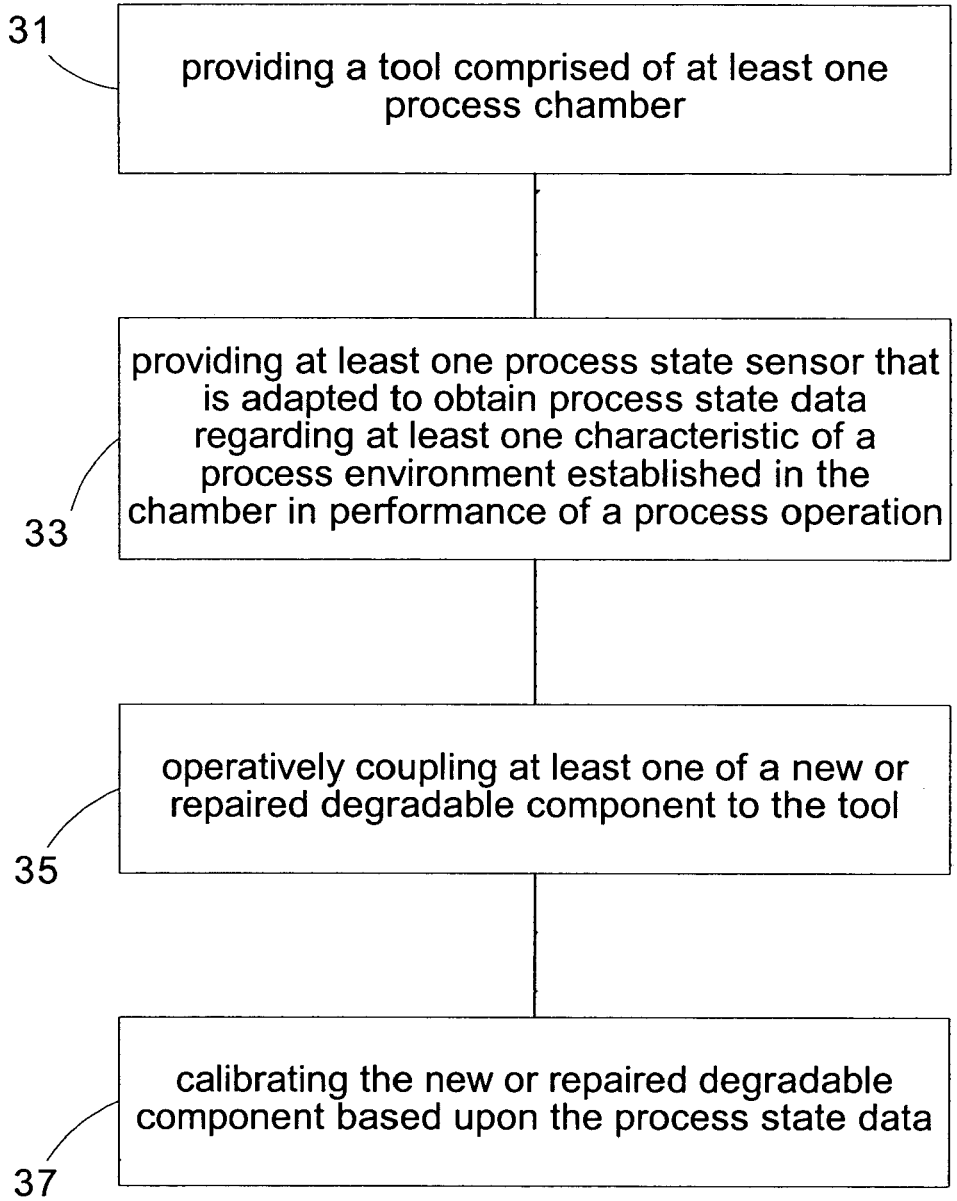
FIG. 3 is a simplified flow diagram of a method of calibrating new or repaired degradable components on a tool in accordance with one illustrative embodiment of the present invention.

The present invention is generally directed to various methods and systems for calibrating degradable components using process state data. One illustrative method is depicted in flowchart form in FIG. 3. As shown therein, in one illustrative embodiment, the method comprises providing a tool comprised of at least one process chamber, as indicated in block 31, and providing at least one process state sensor that is adapted to obtain process state data regarding at least one characteristic of a process environment established in the chamber in performance of a process operation, as recited in block 33. The method further comprises operatively coupling at least one of a new or repaired degradable component to the tool, as set forth in block 35, and calibrating the new or repaired degradable component based upon the process state data, as recited in block 37. In further embodiments, the method comprises processing a plurality of additional workpieces in the process tool after the new or repaired degradable components have been calibrated using process state data in accordance with one aspect of the present invention.

In another illustrative embodiment, the method comprises providing a tool comprised of at least one process chamber, providing at least one process state sensor that is adapted to obtain process state data regarding at least one characteristic of a process environment established in the chamber in performance of a process operation, providing a controller that is adapted to access the process state data, and operatively coupling at least one of a new or repaired degradable component to the tool, wherein the controller performs the step of calibrating the new or repaired degradable component based upon the process state data.

In yet another illustrative embodiment, the method comprises providing a tool comprised of at least one process chamber, providing at least one process state sensor that is adapted to obtain process state data regarding at least one characteristic of a process environment established in the chamber in performance of a process operation, providing a controller that is adapted to access the process state data, and operatively coupling at least one of a new or repaired degradable component to the tool, the new or repaired degradable component having an initial calibration, wherein the controller performs the step of confirming that the initial calibration of the new or repaired degradable component is correct based upon the process state data.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a tool comprised of at least one process chamber;
   providing at least one process state sensor that is adapted to obtain process state data regarding at least one characteristic of a process environment established in said process chamber in performance of a process operation;
   operatively coupling at least one of a new or repaired degradable component to said tool; and
   calibrating said new or repaired degradable component based upon said process state data.

2. The method of claim 1, wherein said new or repaired degradable component comprises at least one of a sensor, a flow control device and an electrical control device.

3. The method of claim 1, wherein said tool is adapted to perform at least one of a deposition process, a metrology process, a photolithography process, and exposure process, an etching process, an ion implant process and a heating process.

4. The method of claim 1, wherein said process state data is comprised of at least one of a temperature, a pressure, a partial pressure of a gas species, an identification of multiple gas species within said processor environment, an RF voltage, and an RF current.

5. The method of claim 1, wherein said process state sensor comprises at least one of a residual gas analysis sensor, an optical emission spectrometry sensor, a Fourier transform infra red sensor, an RF sensor, an RF current sensor, a temperature sensor and a pressure sensor.

6. The method of claim 1, wherein calibrating said new or repaired degradable component based upon said process state data comprises confirming that an initial calibration of said new or repaired component is correct based upon said process state data.

7. The method of claim 1, wherein a controller is adapted to access said process state data and perform the step of calibrating said new or repaired degradable component.

8. The method of claim 1, further comprising declaring a fault condition if said step of calibrating said new or repaired degradable component comprises determining a correction factor in excess of a preselected allowable limit.

9. The method of claim 1, further comprising processing a plurality of additional wafers through said tool after said step of calibrating said new or repaired degradable component has been performed.

10. A method, comprising:
providing a tool comprised of at least one process chamber;
providing at least one process state sensor that is adapted to obtain process state data regarding at least one characteristic of a process environment established in said chamber in performance of a process operation;
providing a controller that is adapted to access said process state data;
operatively coupling at least one of a new or repaired degradable component to said tool; and
wherein said controller performs the step of calibrating said new or repaired degradable component based upon said process state data.

11. The method of claim 10, wherein said new or repaired degradable component comprises at least one of a sensor, a flow control device and an electrical control device.

12. The method of claim 10, wherein said tool is adapted to perform at least one of a deposition process, a metrology process, a photolithography process, and exposure process, an etching process, an etching process, an ion implant process and a heating process.

13. The method of claim 10, wherein said process state data is comprised of at least one of a temperature, a pressure, a partial pressure of a gas species, an identification of multiple gas species within said processor environment, an RF current and an RF voltage.

14. The method of claim 10, wherein said process state sensor comprises at least one of a residual gas analysis sensor, an optical emission spectrometry sensor, a Fourier transform infra red sensor, a temperature sensor an RF voltage sensor, an RF current sensor, and a pressure sensor.

15. The method of claim 10, wherein calibrating said new or repaired degradable component based upon said process state data comprises confirming that an initial calibration of said new or repaired component is correct based upon said process state data.

16. The method of claim 10, further comprising declaring a fault condition if said step of calibrating said new or repaired degradable component comprises determining a correction factor in excess of a preselected allowable limit.

17. The method of claim 10, further comprising processing a plurality of additional wafers through said tool after said step of calibrating said new or repaired degradable component has been performed.

18. A method, comprising:
providing a tool comprised of at least one process chamber;
providing at least one process state sensor that is adapted to obtain process state data regarding at least one characteristic of a process environment established in said chamber in performance of a process operation;
providing a controller that is adapted to access said process state data;
operatively coupling at least one of a new or repaired degradable component to said tool, said at least one of a new or repaired degradable component having an initial calibration; and
wherein said controller performs the step of confirming that said initial calibration of said new or repaired degradable component is correct based upon said process state data.

19. The method of claim 18, wherein said new or repaired degradable component comprises at least one of a sensor, a flow control device and an electrical control device.

20. The method of claim 18, wherein said tool is adapted to perform at least one of a deposition process, a metrology process, a photolithography process, and exposure process, an etching process, an etching process, an ion implant process and a heating process.

21. The method of claim 18, wherein said process state data is comprised of at least one of a temperature, a pressure, a partial pressure of a gas species, an identification of multiple gas species within said processor environment, an RF voltage sensor, and an RF current sensor.

22. The method of claim 18, wherein said process state sensor comprises at least one of a residual gas analysis sensor, an optical emission spectrometry sensor, a Fourier transform infra red sensor, a temperature sensor and a pressure sensor.

23. The method of claim 18, further comprising processing a plurality of additional wafers through said tool after said step of calibrating said new or repaired degradable component has been performed.

* * * * *